United States Patent [19]

Takeuchi et al.

[11] 4,141,615
[45] Feb. 27, 1979

[54] CASING FOR ELECTRICAL EQUIPMENT

[75] Inventors: Takeshi Takeuchi; Takao Terasawa, both of Tokyo, Japan

[73] Assignee: Hochiki Corporation, Tokyo, Japan

[21] Appl. No.: 820,188

[22] Filed: Jul. 29, 1977

Related U.S. Application Data

[63] Continuation of Ser. No. 659,192, Feb. 19, 1976, abandoned.

[30] Foreign Application Priority Data

Feb. 24, 1975 [JP] Japan .................................. 50-17250

[51] Int. Cl.² .......................................... H01R 13/44
[52] U.S. Cl. .................................... 339/36; 174/65 R; 333/99 R; 339/177 R
[58] Field of Search .................. 339/36, 96, 177, 242; 174/64, 65 R; 333/10, 99 R

[56] References Cited

U.S. PATENT DOCUMENTS

| | | | |
|---|---|---|---|
| 1,242,533 | 10/1917 | Duck | 174/64 |
| 1,279,256 | 9/1918 | Casper | 174/65 R |
| 2,087,384 | 7/1937 | Lee | 339/242 |
| 3,641,464 | 2/1972 | Crowhurst et al. | 333/10 |
| 3,768,063 | 10/1973 | Coffman | 339/177 E |

*Primary Examiner*—Joseph H. McGlynn
*Attorney, Agent, or Firm*—Frank J. Jordan

[57] ABSTRACT

An improved casing for an electrical component intended for use in wired television broadcast is provided with a plurality of terminal connecting plug seats having axial bores therethrough adapted to receive coaxial cable ends for connection. A predetermined number of the connecting plug seats have the axial bores thereof blocked to the passage of the coaxial cable ends by sealing members molded integrally with the casing and plug seats.

5 Claims, 10 Drawing Figures

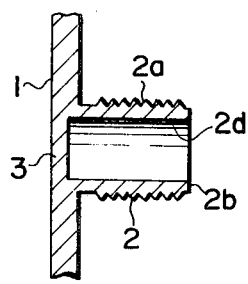
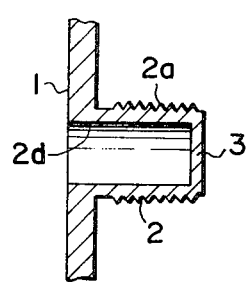
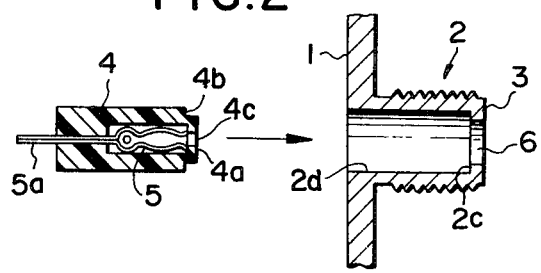
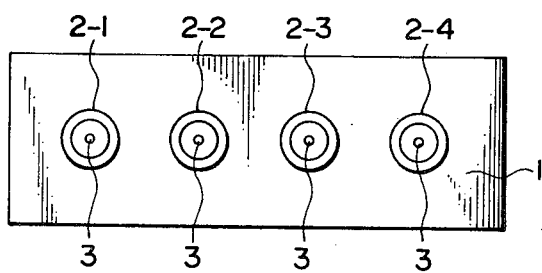
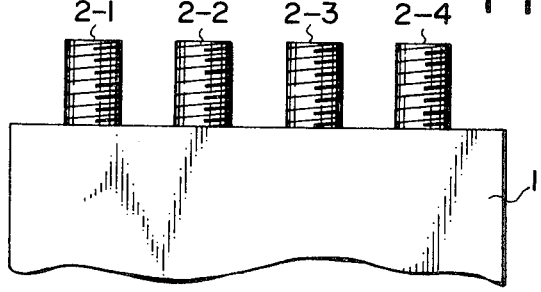

CASING FOR ELECTRICAL EQUIPMENT

This is a continuation of application Ser. No. 659,192, filed Feb. 19, 1976, now abandoned.

BACKGROUND OF THE INVENTION

1. Field of the Invention

This invention relates to a casing of an electrical component used for wired television broadcast and having plug connector seats to connect coaxial cable ends therewith.

The casing of such electrical components, such as a repeater, a splitter or a coaxial cable — coaxial cable connector, affords inadequate electrical protection in high frequency applications and needs, therefore, to be improved.

2. Description of the Prior Art

Television signal waves in the magaherz frequency range as are transmitted over a coaxial with cable. It is already known that the electrical stability of the connection can be enhanced by integrally molding the connecting plug seats which serve as connecting terminals for the coaxial cable ends and the casing which supports the plug seats and contains an internal electric circuit. Despite the increased popularity and use of CATV systems and a rapid increase in the number of electrical components used such as repeaters, splitters and coaxial cable - coaxial cable connectors, the development of a casing with connecting plug seats capable of accommodating the increased capacity needed while concomitantly maintaining its standard of reliability relative to the preservation of the transmission of the megahertz frequency has not yet taken place.

SUMMARY OF THE INVENTION

An object of this invention is to develop a casing with connecting plug seats which affords protection against the occurrence of any significant peripheral capacity variation.

A further object of this invention is to provide a casing with connecting plug seats which has a structure capable of accommodating an increase of subscribers or the additional installation of branch lines and which affords protection against the occurrence of the aforesaid peripheral capacity variation as far as possible.

A still further object of this invention is to provide a casing with connecting plug seats which has improved shielding characteristics in order to minimize the effort of external electric waves or the radiation of electric waves from a transmission line.

In a variety of components, such as a repeater, a splitter, a branch unit and a coaxial cable - coaxial cable connector, etc. which are connected to coaxial cable ends, when a change in the shield function or in the peripheral capacity occurs in a connecting portion or in an electric circuit contained therein even so minute that it is barely noticeable, it creates noise on the megahertz signal waves of a television broadcast signal, it degrades the definition of a color picture and it causes a picture quality change such as snow, echo ghost etc. The transmission line of a coaxial cable possesses an impedance of, for example, 75 Ω with respect to the earth and is held in an unbalanced potential state. Therefore, where foreign matter or permeating water which alters the characteristic impedance prescribed between the core and the outer conductor of the coaxial cable reaches the connecting portion and the internal electric circuit connected thereto, mismatching takes place in the transmission line due to the unbalance of the characteristic impedance, and an echo ghost attributable thereto is created. The mismatching is measured as a return loss, or may be described as a change in the voltage standing wave ratio. The various components used in the CATV system increases significantly in number with a corresponding expansion of the system, so that even when the peripheral capacity change of the connecting portion or the internal electric circuit of the individual component is very slight, the mismatchings tend to accumulate with the large number of components passed through and the megahertz signal waves are distorted more than anticipated. The capacity change is prone to generate signal level differences among a large number of channels. When the signal level difference is enlarged during transmission within the system before the signal reaches a terminal station, a cross modulation (amplification in a region beyond the maximum output in an amplification characteristic) cannot be avoided by the adjustment of the input signal level of an amplifier. The result is that the TV picture tube emits a beat. It is thus experienced comparatively frequently that a beat noise appears in a picture. Even if it is intended to eliminate the cause of the distortion of such megahertz signal transmission after the installation of the system or during maintenance of the system, an ordinary repairman cannot make the necessary repairs because the problem is widespread within the system and is complex. Accordingly, a high degree of technical skill is required. Moreover, it is extremely difficult to correct the situation where the problem is system wide. Since the various electrical components connected with the coaxial cable ends are susceptible to the problems described above, it would be of great benefit to prevent the occurrence of the capacity change and the change in shielding characteristics.

This invention is especially important in the case of manufacturing the casing of a component in which the number of spare or extra terminals is increased in anticipation of an increase in the number of new subscribers or connected terminal components in order that the anticipated increase may be satisfied without the need to replace existing equipment with equipment having more terminals.

Many kinds of equipment employed in television broadcast are mass-produced. When discussed in relation to this invention, some kinds of components can be classified in accordance with the number of terminals. For example, branch units include a 1-branch unit, a 2-branch unit, a 4-branch unit ... which are respectively fabricated in large quantities. The numbers of terminal connecting plug seats in such branch units are three, four, sic .... in the order mentioned. One of the plug seats is used for input, one for output, and one, two, four ... for branching in the order mentioned. In the actual installation, a type is selected which is consistent with the number of branches so that no terminal connecting plug seat may be left unused. A type which has more terminals than are really required is sometimes adopted in expectation of the new increase. In some instances the plug seats which are intended for future use are provided with resinous caps of low cost or with metallic cap nuts of higher cost so as to prevent the interior of the casing from communicating with the external air. Such communication is to be avoided in order to prevent a rapid increase of uncertain factors affecting the preservation of the megahertz signal transmission. In a large-scale CATV system having 10,000 or more subscribers, the various components are provided with caps on unused plug seats in anticipation of an increase of, for example, 30 – 100% in subscribers. The isolation of the interior from the exterior of the casing due to the installation of the caps is not effective over a long term. The introduction into the casing, of multifarious external electric waves such as ignition electric waves, high frequencies such as are radiated from motors and the corona discharge of high-voltage transmission lines, is sometimes unpreventable because of the nature of the material of the caps and the secular change or the change of the put-on state thereof. Likewise, the state changes of the cap frequently allows water and external foreign matter, such as dust, to enter. The equipment casing in which any state change is particularly large furthers the peripheral capacity change of the connecting portion or the internal electric circuit connected therewith.

This invention consists in a casing construction for an electrical component subject to certain variables which have hitherto had a negligible effect upon the megahertz signal transmission except when the scale of the system is expanded, and which components employ connecting plug seats for spare terminals intended to cope with the anticipated need for additional terminals. Thus, when the connecting plug seat and a casing portion are integrally molded, a sealing member for isolating the interior and exterior of the casing is simultaneously molded in the internal space of the plug seat. The result of the invention has been a more enhanced mass production effect by reducing the number of kinds or types of equipment such as a splitter, a branch unit and a repeater, and a CATV system of more enhanced reliability has been made possible.

BRIEF DESCRIPTION OF THE DRAWINGS

FIGS. 1a and 1b are fragmentary cross-sectional views of connecting plug seats in the wall of an electrical component;

FIG. 2 is a cross-sectional exploded view of a connecting component which is used for the connection of a core with a connecting plug seat as shown in FIG. 1b;

FIG. 3a is a plan view of that portion of the casing of a component in which the connecting plug seats of this invention are integrally formed, FIG. 3b is a fragmentary side view of the casing shown in FIG. 3a, FIGS. 4a and 4b are cross-sectional views showing examples of mold assemblies which may be used when all the plug seats are integrally molded on one side of the casing. FIG. 4a is a view of the mold assembly in the case where a sealing member is to be integrally molded inwardly of the connecting port of the plug seat, while FIG. 5a is a view of the mold assembly in the case where the sealing member is integrally molded inwardly of the connecting port of the plug seat, while FIG. 5b is a view of the mold assembly in the case where the sealing member is integrally molded at the connecting port of the plug seat.

DETAILED DESCRIPTION OF THE INVENTION

The casing of the electrical component with connecting plug seats according to this invention comprises connecting plug seats, sealing members for isolating the interior and the exterior at the connecting ports of the plug seats, and is adapted to accommodate an internal electric circuit connected through the plug seats, all the constituent parts being integrally molded. A structure of the casing and the connecting plug seats which are integrally molded by die casting or by any other method, not only makes unnecessary the need to mechanically mount the plug seats on the casing thus achieving a reduction in cost, but also results in the advantage that the casing will remain waterproof without any permeation of water from the mounted parts, the advantage that electrical performances are improved and the advantage that the mechanical solidity is enhanced. The equipment casing with connecting plug seats is so improved that the preservation of the megahertz signal transmission can be ensured to a higher degree.

In order that the invention may be more fully comprehended it will now be described, by way of example, with reference to the accompanying drawings.

Figure 6:
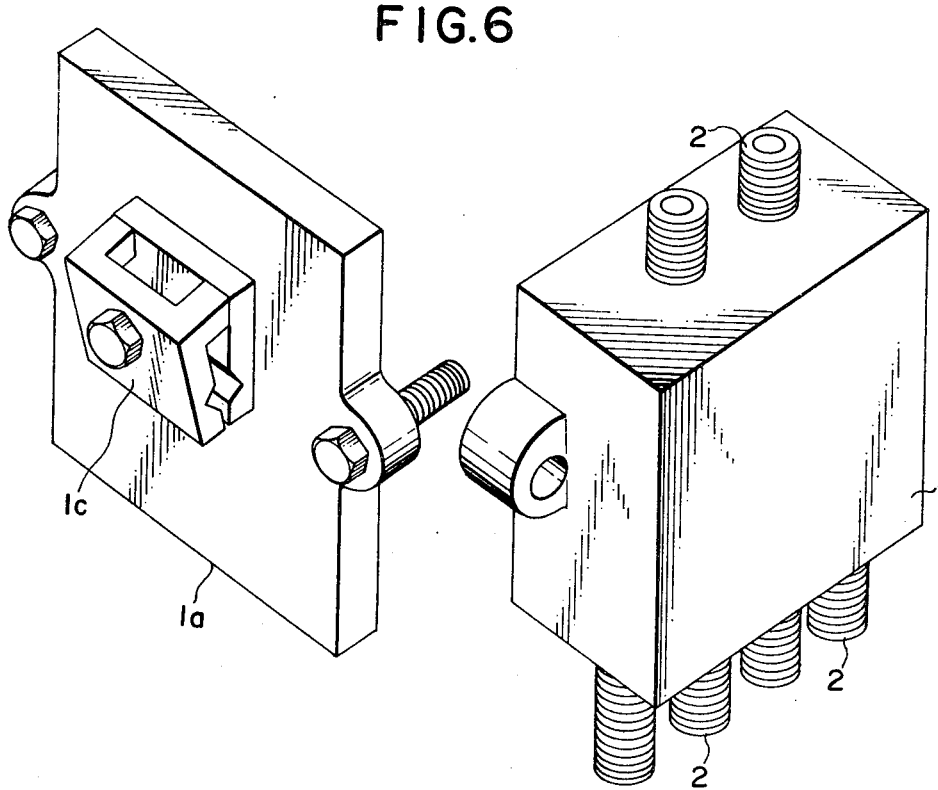
FIG. 6 is a perspective view showing a casing for coaxial cables in which the connecting plug seats of this invention and the sealing members thereof are integrally molded.

FIGS. 3a, 3b and 6 show a casing with four terminals, which has great utility when taking branch lines from a trunk line of a CATV system. When the casing is employed where a large increase in the number of subscribers is anticipated, for example, when it is arranged in an area where it is planned to construct a high-storied building for residences, the additional installation of the branch lines can be carried out as may be needed. When this invention is applied to a splitter with more terminals, for example, with 8, 16, 32 ... terminals on the line close to the terminal side, the demand for an increase in terminal equipment is easily met.

The casing with connecting plug seats according to this invention has spare terminals added in order to immediately meet the demand for an increase in the number of splitting, branching or output terminals from the equipment connected with the coaxial cable end, and is formed as shown in FIGS. 1a and 1b with sealing members 3 for isolating the interior and the exterior at the connecting ports of at least the connecting plug seats intended to be used as the spare terminals.

Referring to FIGS. 1a and 1b, a connecting plug seat 2 having a bore 2d is molded integrally with a part 1 of the casing and has an axial bore 2d or connecting port extending therethrough and a threaded portion 2a at the outer periphery thereof. The coaxial cable end, not shown, is provided with a nut which is connected with the shield housing by screw engagement with the threaded portion 2a. FIG. 2 shows a contact pin 5 which is connected with a core (not shown) of the coaxial cable. The pin 5 is protected by an insulator member 4 which is received in the connecting port of the plug seat 2. An internal electric circuit (not shown) which is accommodated in the casing 1 is electrically connected with the contact pin 5 by a lead wire 5a. The fore end part 4a of the insulator member 4 in front of the contact pin 5 is formed with a hole 4c, through which the core of the coaxial cable is connected with the contact pin 5. Since the cable core is inserted into the connecting port of the plug seat 2 in this manner, the sealing member 3 molded integrally with the plug seat is bored to provide a connecting hole 6 when the spare plug seat 2 becomes necessary, that is, when it is used in compliance with the demand for an increase in terminals. The boring for providing the hole 6 can be executed without any special tool. The tip end of a screwdriver suffices therefor. Where a tool exclusively for the provision of the hole, for example, a manual or electric drill is employed owing to a sufficiently increased amount of use of the equipment, a circular hole is formed after centering so as to leave a stepped portion 2c. By forming a stepped portion 4b at the peripheral edge of the fore end 4a of the insulator member 4, and bringing the stepped portions 4b and 2c into registry, the insulator member 4 protecting the contact pin 5 can be prevented from falling out of the connecting plug seat 2. Where the sealing member 3 is integrally molded at the innermost part of the connecting port of the plug seat 2 as shown in FIG. 1a, it is fully drilled. The insulator member 4 which is used jointly with such plug seat 2 is desirably formed with a flange portion (not shown) at the end opposite to the fore end portion 4a, so that the insulator member 4 is similarly prevented from falling out of the plug seat 2. Where, in this manner, the sealing member 3 is formed at an inner position with respect to the initial end of the connecting port, the boring means is guided to the connecting port and the boring can be easily completed.

Figure 4A:
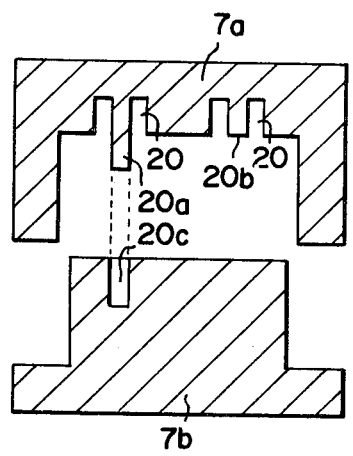
Figure 4B:
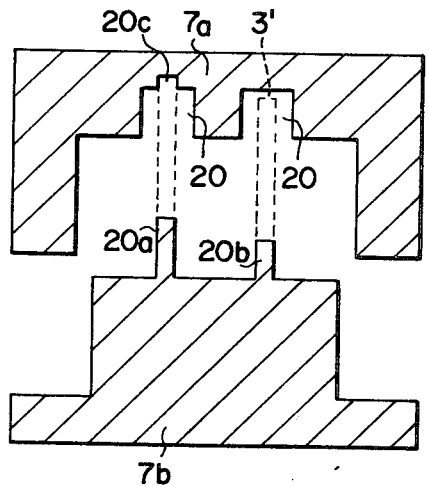
FIG. 4b is a view of the mold assembly in the case where the sealing member is to be integrally molded at the connecting port of the plug seat.

The equipment casing with connecting plug seats according to this invention does not raise the manufacturing cost but rather can lower it, and may be mass-produced by the use of any of the mold assemblies exemplified in FIGS. 4a, 4b, 5a and 5b. Examples of mold assemblies in the case of integrally molding the connecting plug seats on one side of the casing are shown in FIGS. 4a and 4b. When such mold assembly is used, the integrally molded casing has one side left as an opening, the one side corresponding to a lid 1a of the finished casing as shown in FIG. 6, and is formed with walls of the casing on the other five sides. Where, in a mold 7a having a mold cavity 20 for forming the connecting plug seat 2, the sealing member 3 is formed at the innermost part of the connecting port of the plug seat 2, a short mold part 20b provides for leaving the connecting port as illustrated in FIG. 4a. In addition, in order to leave the connecting port of the connecting plug seat which is to be immediately used, a mold part 20a longer than the mold part 20b is provided in one of the mold cavities 20. In correspondence with the mold part 20a, a recess 20c which receives it is formed in an opposite mold 7b. When the sectional molds 7a and 7b are joined together, a main mold cavity is defined therebetween to form the walls of the casing, and a mold cavity 3' for the sealing member is defined between the fore end of the short mold part 20b and the main mold cavity (refer to FIG. 4b).

The mold cavity 20 for the connecting plug seat as provided in the mold 7a in FIG. 4b mates with the short mold part 20b projecting from the opposite mold 7b in order to form the sealing member 3 at the initial end of the connecting port of the connecting plug seat 3. When the molds 7a and 7b are combined, the mold cavity 3' for the sealing member 3 is defined between the mold cavity 20 for the plug seat and the short mold part 20b. In addition, the long mold part 20a is provided in the mold 7b in order to form a through opening in the connecting port of the plug seat to be immediately used. The plug seat mold cavity 20 of the mold 7a as mates with the mold part 20a is continuously formed with the recess 20c for receiving the fore end of the mold part 20a.

Figure 5A:
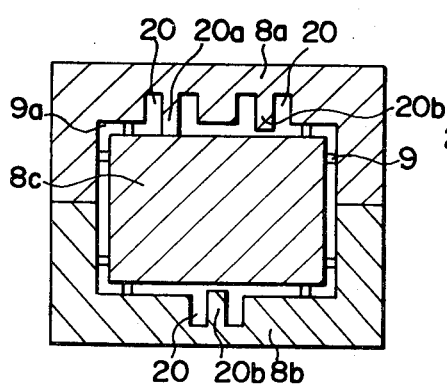
FIGS. 5a and 5b are cross-sectional views showing examples of mold assemblies for integrally molding the plug seats on two sides of the casing.
Figure 5B:
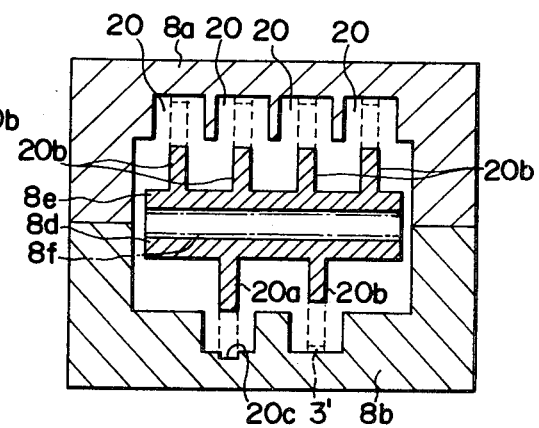

FIGS. 5a and 5b show examples of mold assemblies in the case where the connecting plug seats are to be integrally molded on at least two sides of the equipment casing. Where the sealing member 3 is integrally molded at the innermost part of the connecting port, the mold assembly of FIG. 5a is the basic one. Outer molds 8a and 8b to be combined and an inner mold 8c for defining the internal space of the casing are required at the minimum. The finished casing is open on at least one side in order to provide for removal of the inner mold 8c. Shorter mold parts 20b are provided in mold cavities 20 for the connecting plug seats as formed in the outer molds 8a and 8b. In order to form the connecting port with the through opening, a long mold part 20a is provided in at least one of the mold cavities 20, and its fore end abuts on the surface of the inner mold 8c. The sealing member 3 is integrally molded owing to an interspace which is defined between the short mold part 20b and the inner mold 8c. In order to maintain a main mold cavity 9a for formation of the casing walls, a suitable number of spacers 9 are used. The spacers are buried in the finished casing walls, or are removed after the casting has been completed. Where the spacers are not used, the inner mold 8c is fixed to an auxiliary metallic mold (not shown) covering the part which is made the opening side in order to remove the inner mold 8c, and the registration between the outer molds 8a and 8b can thus be securely made.

FIG. 5b shows the basic example in the case where the sealing members 3 are integrally molded at the initial ends of the connecting ports of the connecting plug seats to be molded on two or more sides of the casing. In this case, there are used a first inner mold 8e which cooperation with an outer mold 8a having mold cavities 20 for molding the connecting plug seats 2 on one side of the casing and which is provided with short mold parts 20b to be situated in the mold cavities 20 and for forming the connecting portions. A second inner mold 8d opposes another outer mold 8b having mold cavities 20 for molding the connecting plug seats 2 on another side of the casing and which is provided with the short mold parts 20b to be situated in the mold cavities for forming the connecting portions. Long mold parts 20a are provided in conformity with the number by which the connecting ports with through openings are to be formed. The mold cavity 20 to mate with the long mold part 20a is formed with a recess 20c for receiving the fore end thereof, in a manner to be continuous to the cavity. The sealing member 3 is integrally molded by an interspace which is defined between the short mold part 20b and the mold cavity 20.

An auxiliary metallic mold (not shown) covering one side of the casing as is opened in order to take out the first and second inner molds 8e and 8d from the molded casing is interposed of 8f between the first and second inner molds 8e and 8d, and these inner molds are combined with the respectively corresponding outer molds 8a and 8b.

The positional control of the outer molds, the inner molds and the auxiliary metallic molds can be easily executed by, for example, means to be stated below. The first and second inner molds 8e and 8d held back to back are put in the space inside the combined outer molds 8a and 8b, and the respective inner molds are pushed against the corresponding outer molds in the space. The auxiliary metallic mold is provided with a control member which has a taper surface necessary for displacing the inner mold inwards in order to define a main mold cavity 9a, while the inner mold is provided with a locating portion which has an inverse taper surface for moving itself inwards by the movement of the taper surface into the mold space. By virtue of the mutual control between the taper surfaces and the inverse taper surfaces, the first and second inner molds 8e and 8d are returned to the corresponding surfaces of the auxiliary metallic mold interposed therebetween. In the returned state, all the molds are fixed thereby defining the correct main mold cavity 9a (refer to FIG. 5a). This example is effective especially in case of forming the connecting plug seats on the two opposing sides. The positional control in the case where the connecting plug seats are formed on two adjacent sides, makes use of proper means such as a pin - slit combination and a simple bolt - nut coupling.

Where the position to mold the sealing member 3 thereat is made intermediate between both the ends of the connecting portion of the plug seat, the short mold part 20b is made still shorter, and another short mold part extending towards the connecting port is provided in the inner mold or the mold on the opposite side. The sealing member 3 is formed by an interspace which is defined between these short mold parts. Where the sealing member is molded in the form of a protuberance at a position deeper than or inward of the wall, the short mold part 20b may be lengthened and a recess for defining a space necessary for molding the sealing member may be correspondingly formed in the mold surface on the opposite side.

FIG. 6 shows a splitter illustrative of an example of this invention. The casing 1 which is molded with one side held in the open state is combined with the lid 1a separately molded, whereby the influences of external factors which give rise to a capacity variation and an imperfect shield are removed therefrom. The lid 1a is additionally provided with fixing means 1c for mounting the casing on a support wire or the like. The casing with connecting plug seats is preferably manufactured by die casting by the use of a material whose principal component is aluminum, and it is molded by various integral molding means with the foregoing several molds further divided. Although the threaded portion 2a provided at the outer periphery of the connecting plug seat is easily made by working after the molding, it can be formed simultaneously with the molding step in case of employing a mold assembly whose number of sections is large, especially in case of using a split mold assembly which divides the connecting plug seat in two.

What is claimed is:

1. In a casing forming an electrical component for use in a wired television broadcast such as a repeater, a branch unit, a splitter and a coaxial cable-coaxial cable connector, said casing being entirely made from a metallic material, said casing comprising a plurality of walls defining a generally hollow casing enclosure, a plurality of means defining terminal connecting metallic plug elements extending outwardly from at least one of said walls, said plug elements being integrally molded with said at least one wall, each of said plug elements having a generally cylindrical configuration and having external threads for threadedly receiving coaxial cable ends, each of said plug elements having a central bore, and metallic sealing plug seat means in the bores of at least some of said plug elements to seal off said bores, said sealing plug seat means being integrally molded with said plug elements and said casing walls to provide an airtight seal between the inside and outside of the casing to thereby airtightly seal the interior of said casing, said one wall of said casing along with said integrally molded plug elements and said integrally molded plug seat means being of a one-piece integral metallic material, said sealing plug seat means being adapted to be manually ruptured and removed from its respective bore when it is desired to connect a cable end to the respective plug element.

2. In a casing according to claim 1 wherein the bores in at least two of said plug elements are through bores without a sealing plug means therein.

3. In a casing according to claim 1 wherein said sealing plug seat means are formed in said bores at the outer terminating ends of said plug elements.

4. In a casing according to claim 1 wherein said sealing plug seat means are formed in said bores at the inner terminating ends of said plug elements.

5. In a casing according to claim 4 wherein said sealing seat means are generally coplanar with said at least one wall.

* * * * *